(12) United States Patent
Lee et al.

(10) Patent No.: US 10,637,396 B1
(45) Date of Patent: Apr. 28, 2020

(54) TRANSCONDUCTANCE CONTROLLING CIRCUIT

(71) Applicant: Industrial Technology Research Institute, Hsinchu (TW)

(72) Inventors: Tai-Hsing Lee, Hsinchu (TW); Jie Zhang, New Taipei (TW)

(73) Assignee: INDUSTRIAL TECHNOLOGY RESEARCH INSTITUTE, Hsinchu (TW)

(*) Notice: Subject to any disclaimer, the term of this patent is extended or adjusted under 35 U.S.C. 154(b) by 0 days.

(21) Appl. No.: 16/251,036

(22) Filed: Jan. 17, 2019

(30) Foreign Application Priority Data

Oct. 16, 2018 (TW) .............................. 107136318 A

(51) Int. Cl.
*H03B 5/12* (2006.01)
*H03B 5/30* (2006.01)

(52) U.S. Cl.
CPC ......... *H03B 5/1271* (2013.01); *H03B 5/1212* (2013.01); *H03B 5/1278* (2013.01); *H03B 5/30* (2013.01); *H03B 2200/009* (2013.01)

(58) Field of Classification Search
CPC .. H03B 5/1212; H03B 5/1271; H03B 5/1278; H03B 2200/009
See application file for complete search history.

(56) References Cited

U.S. PATENT DOCUMENTS

| | | | |
|---|---|---|---|
| 7,414,488 B2 | 8/2008 | Lee et al. | |
| 7,532,001 B2 | 5/2009 | Lee et al. | |
| 8,106,718 B2 | 1/2012 | Lee et al. | |
| 9,035,708 B2 | 5/2015 | Sun | |
| 9,543,891 B2 | 1/2017 | Ryu et al. | |
| 9,634,607 B2 | 4/2017 | Nguyen et al. | |

(Continued)

FOREIGN PATENT DOCUMENTS

| | | |
|---|---|---|
| TW | 200726070 A | 7/2007 |
| TW | 200814510 A | 3/2008 |

(Continued)

OTHER PUBLICATIONS

Taiwan Patent Office, Office Action, Patent Application Serial No. 10736318, dated Feb. 22, 2018, Taiwan.

(Continued)

*Primary Examiner* — Jeffrey M Shin

(57) ABSTRACT

A transconductance controlling circuit is provided. The transconductance controlling circuit includes a resonance circuit, a negative-resistance unit-circuit and a transconductance boosting circuit. The resonance circuit generates an oscillation signal. The negative-resistance unit-circuit is coupled to a resonance circuit and includes a first transistor and a second transistor. The transconductance boosting circuit is coupled to the negative-resistance unit-circuit and includes a third transistor and a fourth transistor. A first drain of the first transistor is coupled to a third drain of the third transistor, a first gate of the first transistor is coupled to a third gate of the third transistor, the first gate of the first transistor is coupled to a second drain of the second transistor, and a first base of the first transistor is coupled to a fourth base of the fourth transistor and to a fourth source of the fourth transistor.

15 Claims, 3 Drawing Sheets

(56) References Cited

U.S. PATENT DOCUMENTS

| | | | |
|---|---|---|---|
| 2011/0050327 A1* | 3/2011 | Fujitani | H02M 3/07 327/536 |
| 2014/0266480 A1 | 9/2014 | Li et al. | |
| 2017/0077871 A1 | 3/2017 | Chakrabarti et al. | |
| 2017/0257063 A1* | 9/2017 | Martineau | H03B 5/1243 |
| 2018/0212567 A1* | 7/2018 | Lin | H03B 5/1212 |

FOREIGN PATENT DOCUMENTS

| | | |
|---|---|---|
| TW | 201105024 A | 2/2011 |
| TW | 201242237 A | 10/2012 |
| TW | 201312929 A | 3/2013 |
| TW | 201427284 A | 7/2014 |
| TW | I454044 B | 9/2014 |

OTHER PUBLICATIONS

Nguyen et al., "A 64 GHz 5 mW Low Phase Noise Gm-boosted Colpitts CMOS VCO with Self-switched Biasing Technique," 2015 International Microwave Symposium (IMS), May 2015, 4 pages, IEEE, US.

Huang et al., "Chip design of a 5.6-GHz 1-V wide tuning range frequency synthesizer with Gm-boosting Colpitts VCO for Biomedical Application," 2014 International Symposium on Bioelectronics and Bioinformatics (ISBB), 2014, 5 pages, IEEE, US.

Lai et al., "Low Power VCO Using Gm-Boosting Technique for Optical Pulse Trains Application," 2016 International Conference on Optical Communications and Networks (ICOCN), 2016, 3 pages, IEEE, US.

Agarwal et al., "A 330 uW, Gm-boosted VCO with -205 dB FoMT and 35 % Tuning Range Using Class-B Biasing," 2014 International Microwave Symposium (IMS), 2014, 4 pages, IEEE, US.

Ha et al., "Gm-Boosted Complementary Current-Reuse Colpitts VCO With Low Power and Low Phase Noise," 2014 IEEE Microwave and Wireless Components Letters, Jun. 2014, 3 pages, IEEE, US.

* cited by examiner

TRANSCONDUCTANCE CONTROLLING CIRCUIT

CROSS REFERENCE TO RELATED APPLICATIONS

This Application claims priority of Taiwan Patent Application No. 107136318 filed on Oct. 16, 2018, the entirety of which is incorporated by reference herein.

TECHNICAL FIELD

The disclosure generally relates to eliminate the phase noise in a voltage-controlled oscillator (VCO), and relates to a transconductance circuit.

BACKGROUND

In the front-end of the radio frequency (RF) circuit, the VCO is utilized to provide a precise local oscillation signal to the mixer to transform the signal into an RF signal or transform the signal to an intermediate frequency (IF) signal.

The phase noise may have a strong effect on the output signal of the VCO. Therefore, if the phase noise is reduced, the burden on the next stage circuit behind the VCO will be decreased. In the prior art, there are two methods to reduce the phase noise of the VCO. One method is by increasing the Q value (quality parameter of the inductor) of the inductor and the other method is by increasing the output power. However, in the method for increasing the Q value of the general transformer inductor, the larger area may need to be configured for the inductor. In addition, the method for increasing the output power may use more power.

SUMMARY

An embodiment of the disclosure provides a transconductance controlling circuit. The transconductance controlling circuit comprises a resonance circuit, a negative-resistance unit-circuit and a transconductance boosting circuit. The resonance circuit generates an oscillation signal according to an input voltage. The negative-resistance unit-circuit is coupled to a resonance circuit and comprises a first transistor and a second transistor. The transconductance boosting circuit is coupled to the negative-resistance unit-circuit and comprises a third transistor and a fourth transistor. A first drain of the first transistor is coupled to a third drain of the third transistor, a first gate of the first transistor is coupled to a third gate of the third transistor, the first gate of the first transistor is coupled to a second drain of the second transistor, and a first base of the first transistor is coupled to a fourth base of the fourth transistor and to a fourth source of the fourth transistor. In addition, the second drain of the second transistor is coupled to a fourth drain of the fourth transistor, a second gate of the second transistor is coupled to a fourth gate of the fourth transistor, the second gate of the second transistor is coupled to the first drain of the first transistor, and a second base of the second transistor is coupled to a third base of the third transistor and to a third source of the third transistor.

An embodiment of the disclosure provides a transconductance controlling circuit. The transconductance controlling circuit comprises a voltage-controlled oscillator and a transconductance boosting circuit. The voltage-controlled oscillator generates an oscillation signal according to an input voltage and comprising a negative-resistance unit-circuit, wherein the negative-resistance unit-circuit comprises a first transistor and a second transistor. The transconductance boosting circuit is coupled to the negative-resistance unit-circuit and comprising a third transistor and a fourth transistor. A first drain of the first transistor is coupled to a third drain of the third transistor, a first gate of the first transistor is coupled to a third gate of the third transistor, the first gate of the first transistor is coupled to a second drain of the second transistor, and a first base of the first transistor is coupled to a fourth base of the fourth transistor and to a fourth source of the fourth transistor. The second drain of the second transistor is coupled to a fourth drain of the fourth transistor, a second gate of the second transistor is coupled to a fourth gate of the fourth transistor, the second gate of the second transistor is coupled to the first drain of the first transistor, and a second base of the second transistor is coupled to a third base of the third transistor and to a third source of the third transistor.

Other aspects and features of the disclosure will become apparent to those with ordinary skill in the art upon review of the following descriptions of specific embodiments of the transconductance controlling circuits.

BRIEF DESCRIPTION OF THE DRAWINGS

The disclosure will become more fully understood by referring to the following detailed description with reference to the accompanying drawings, wherein.

DETAILED DESCRIPTION OF THE DISCLOSURE

The following description is of the best-contemplated mode of carrying out the disclosure. This description is made for the purpose of illustrating the general principles of the disclosure and should not be taken in a limiting sense. The scope of the disclosure is determined by reference to the appended claims.

Transconductance controlling circuits used for eliminating phase noise in a voltage-controlled oscillator (VCO) by configuring a transconductance boosting circuit are provided to overcome the problems described above.

Figure 1:
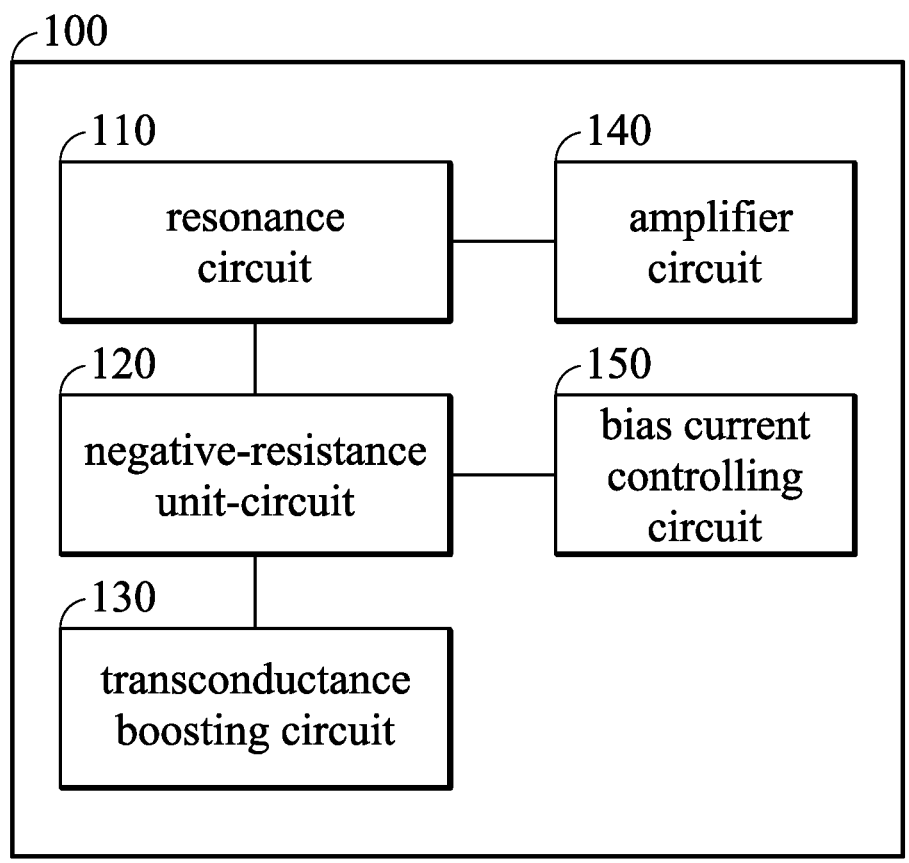
FIG. 1 is a block diagram of a transconductance ($g_m$) controlling circuit according to an embodiment of the disclosure.

FIG. 1 is a block diagram of a transconductance ($g_m$) controlling circuit according to an embodiment of the disclosure. As shown in FIG. 1, the transconductance controlling circuit 100 may comprise a resonance circuit (or LC circuit) 110, a negative-resistance unit-circuit 120, a transconductance boosting circuit 130, an amplifier circuit 140, and bias current controlling circuit 150. In order to clarify the concept of the disclosure, FIG. 1 presents a simplified block diagram in which the elements relevant to the disclosure are shown. However, the disclosure should not be limited to what is shown in FIG. 1. The transconductance controlling circuit 100 may also comprise other elements.

As shown FIG. 1, the resonance circuit 110 may be coupled to a drain power source Vdd, negative-resistance unit-circuit 120 and amplifier circuit 140. The resonance circuit 110 may generate an oscillation signal according to an input voltage Vt. The negative-resistance unit-circuit 120 may be utilized to cancel the effect of parasitic resistance of the resonance circuit 110 to decrease the loss of the oscillation signal generated by the resonance circuit 110. The amplifier circuit 140 is utilized to amplify the oscillation signal generated by the resonance circuit 110 and output the amplified oscillation signal. According to an embodiment of the invention, the resonance circuit 110 and the negative-resistance unit-circuit 120 may be combined to be a voltage-controlled oscillator (VCO).

In addition, as shown in FIG. 1, the transconductance boosting circuit 130 may be coupled to the negative-resistance unit-circuit 120. The transconductance boosting circuit 130 may boost the transconductance ($g_m$) of the transistors of the negative-resistance unit-circuit 120. The bias current controlling circuit 150 may be coupled to the negative-resistance unit-circuit 120. The bias current controlling circuit 150 may control the current flowing through the negative-resistance unit-circuit 120.

Figure 2:
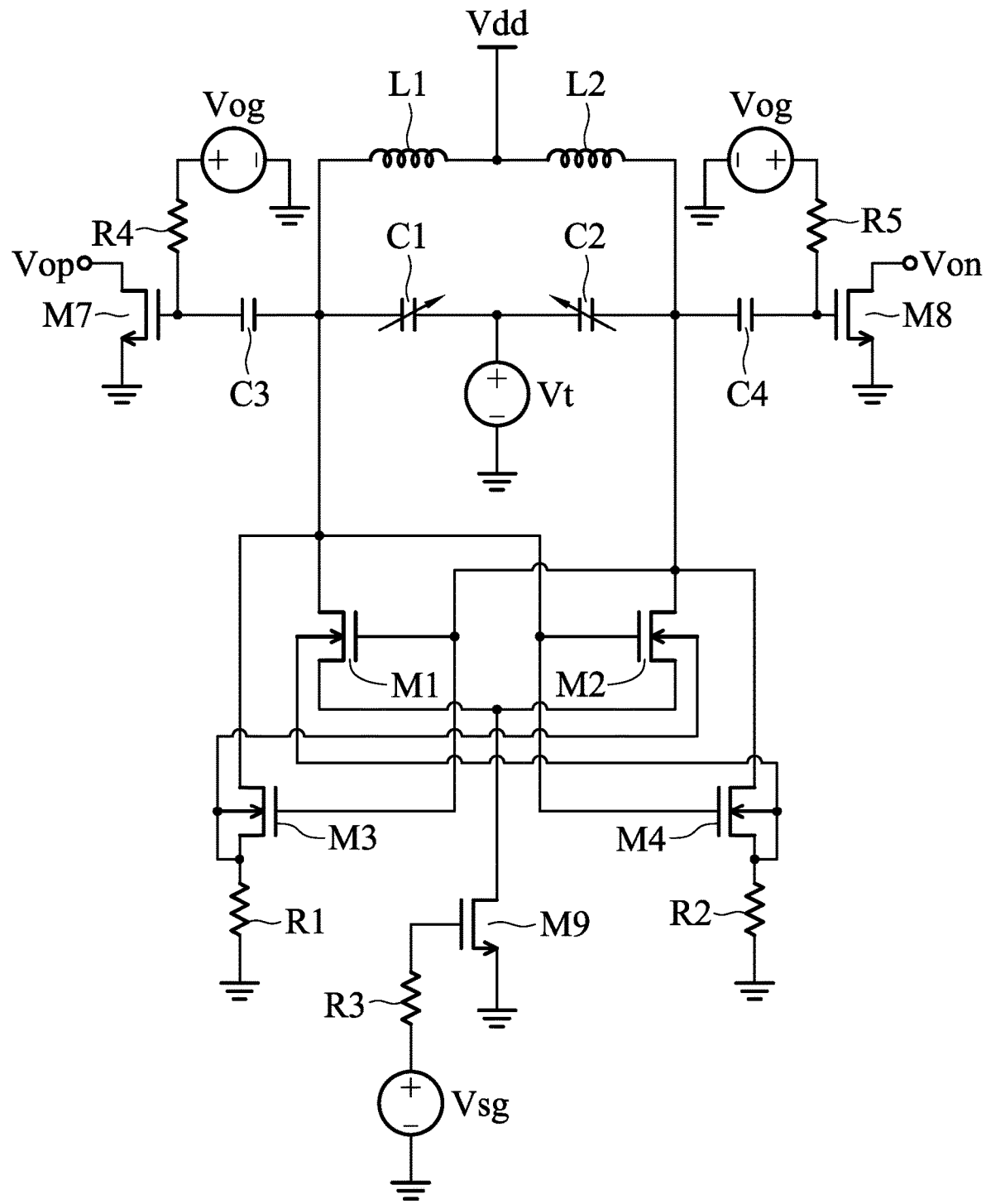
FIG. 2 is a circuit diagram of a transconductance ($g_m$) controlling circuit according to an embodiment of the disclosure.

FIG. 2 is a circuit diagram of a transconductance ($g_m$) controlling circuit according to an embodiment of the disclosure. The circuit diagram of FIG. 2 is for illustrating the embodiments of the disclosure, but the disclosure should not be limited to what is shown in FIG. 2.

As shown in FIG. 2, the resonance circuit 110 may comprise a first inductor L1, a second inductor L2, a first capacitor C1 and a second capacitor C2. In an embodiment, the first inductor L1 and the second inductor L2 may be coupled to the drain power source Vdd, and the first capacitor C1 and the second capacitor C2 may be coupled to the input voltage Vt. The capacitance value of the first capacitor C1 and the second capacitor C2 may be adjusted according to the input voltage Vt to generate the oscillation signals with different frequencies. The first capacitor C1 may be coupled to the amplifier circuit 140 through a third capacitor C3 and the second capacitor may be coupled to the amplifier circuit 140 through a fourth capacitor C4.

As shown in FIG. 2, the negative-resistance unit-circuit 120 may comprise a first transistor M1 and a second transistor M2. A first drain of the first transistor M1 and a second drain of the second transistor M2 may be coupled to the resonance circuit 110 to obtain the drain power source Vdd. In the embodiments of the invention, the transconductance ($g_m$) may be increased by adjusting the base voltage of the first transistor M1 and the second transistor M2. Details for increasing the transconductance ($g_m$) are illustrated below.

According to an embodiment of the invention, the transconductance boosting circuit 130 may comprise a third transistor M3, a fourth transistor M4, a first resistor R1 and a second resistor R2. In addition, the first resistor R1 and the second resistor R2 are coupled to a ground. As shown in FIG. 2, the first drain of the first transistor M1 may be coupled to a third train of the third drain. A first gate of the first transistor M1 may be coupled to a third gate of the third transistor M3. The first gate of the first transistor N1 may be coupled to a second train of the second transistor M2. A first base of the first transistor M1 may be coupled to a fourth base of the fourth transistor M4 and to a fourth source of the fourth transistor M4. The second drain of the second transistor M2 may be coupled to a fourth drain of the fourth transistor M4. A second gate of the second transistor M2 may be coupled to a fourth gate of the fourth transistor M4. The second gate of the second transistor M2 may be coupled to the first drain of the first transistor M1. The second base of the second transistor M2 may be coupled to the third base of the third transistor M3 and to a third drain of the third transistor M3. The first source of the transistor M1 and the second source of the second transistor M2 may be coupled to the bias current controlling circuit 150.

In an embodiment of the invention, when the oscillation signal received by the first transistor M1 is negative level (i.e. the oscillation signal received by the second transistor M2 is positive level), the fourth transistor M4 may adjust the base voltage of the first transistor M1 to boost the transconductance ($g_m$) of the first transistor M1. In an embodiment of the invention, when the oscillation signal received by the second transistor M2 is negative level (i.e. the oscillation signal received by the first transistor M1 is positive level), the third transistor M3 may adjust the base voltage of the second transistor M2 to boost the transconductance ($g_m$) of the second transistor M2. When the transconductance ($g_m$) of the first transistor M1 or the second transistor M2 of the negative-resistance unit-circuit 120 is boosted, the Q values (i.e. the quality parameter of the inductor) of the inductors (i.e. the first inductor L1 and the second inductor L2) of the resonance circuit 110 will be increased to ensure the phase noise of the resonance circuit 110 can be reduced. Details are illustrated by the formulas related to the Q value $Q_L$ of the inductor, the total transconductance $G_T$, and the transconductance $g_m$ below.

According to the formula of the Q value $Q_L$ of the inductor (i.e. the quality parameter of the inductor):

$$Q_L = \frac{1}{G_T}\sqrt{\frac{G_T}{L}},$$

wherein $G_T$ is the total transconductance, $C_T$ is the total parasitic resistance, and L is the inductor value, we can know that when the total transconductance $G_T$ of the VCO (i.e. the resonance circuit 100 and the negative-resistance unit-circuit 120) decreases, the Q value $Q_L$ of the inductor of the resonance circuit 110 will be increased.

Furthermore, according to the formula of the total transconductance $G_T$:

$$G_T = G_L + G_A = \frac{R_S}{(\omega L)^2} - 2g_m,$$

wherein $G_L$ is the electrical conductivity of the inductor, and $G_A$ is the transconductance of the transistor, we can know that when the transconductance $g_m$ of the first transistor M1 or the second transistor M2 of the negative-resistance unit-circuit 120 is boosted, the total transconductance $G_T$ of the VCO (i.e. the resonance circuit 100 and the negative-resistance unit-circuit 120) will be decreased.

Furthermore, according to the formula of the transconductance $g_m$:

$$g_m = \frac{2\sqrt{2\varphi_F + V_{SB}}}{r} \times g_{mb},$$

wherein $\varphi_F$ is the Fermi level coefficient, $V_{SB}$ is the voltage between the source and the base of the transistor, r is body effect coefficient and $g_{mb}$ is the current source model between the drain and the source of the transistor, we can know that when the voltage $V_{SB}$ between the source and the base of the first the transistor M1 or the second transistor M2 of the negative-resistance unit-circuit 120 increases, the transconductance $g_m$ of the first transistor M1 or the second transistor M2 will be boosted.

Therefore, according to all the above formulas, it can be derived that when the third resistor M3 of the transconductance boosting circuit 130 boosts the base voltage of the second transistor M2 (i.e. increase the voltage $V_{SB}$ between the source and the base of the second transistor M2), the transconductance $g_m$ of the second transistor M2 will be boosted, and when the fourth resistor M4 of the transconductance boosting circuit 130 boosts the base voltage of the first transistor M1 (i.e. increase the voltage $V_{SB}$ between the source and the base of the first transistor M1), the transconductance $g_m$ of first transistor M1 will be boosted. When the transconductance $g_m$ of the first transistor M1 or the second transistor M2 of the negative-resistance unit-circuit 120 is boosted, the Q value $Q_L$ of the inductor of the resonance circuit 110 will be increased. Therefore, the transconductance boosting circuit 130 may achieve the goal of reducing the phase noise of the VCO (i.e. the resonance circuit 100 and the negative-resistance unit-circuit 120).

Back to FIG. 2, the amplifier circuit 140 may comprise a first amplifier circuit 141 and a second amplifier circuit 142. The first amplifier circuit 141 may comprise a seventh transistor M7 and output the amplified oscillation Vop with positive level. The second amplifier circuit 142 may comprise an eighth transistor M8 and output the amplified oscillation Von with negative level. The seventh gate of the seventh transistor M7 and the eighth gate of the eighth transistor M8 may be coupled to the amplifier power source Vog respectively through the fourth resistor R4 and fifth transistor R5. In addition, the seventh gate of the seventh transistor M7 may be coupled to the first inductor L1 and the first capacitor C1 through the third capacitor C3, and the eighth gate of the eighth transistor M8 may be coupled to the second inductor L2 and the second capacitor C2 through the fourth capacitor C4. The seventh source of the seventh transistor M7 and the eighth source of the eighth transistor M8 may be coupled to a ground.

As shown in FIG. 2, the bias current controlling circuit 150 may comprise a ninth transistor M9 and a third resistor R3. The ninth drain of the ninth transistor M9 may be coupled to the first source of the first transistor M1 of the negative-resistance unit-circuit 120 and to the second source of the second transistor M2 of the negative-resistance unit-circuit 120. The ninth source of the ninth transistor M9 may be coupled to a ground. The ninth gate of the ninth transistor M9 may be coupled to a adjusting voltage Vsg through the third resistor R3 and the adjusting voltage Vsg may be coupled to a ground. The adjusting voltage Vsg is utilized to control the current flowing through the negative-resistance unit-circuit 120.

Figure 3:
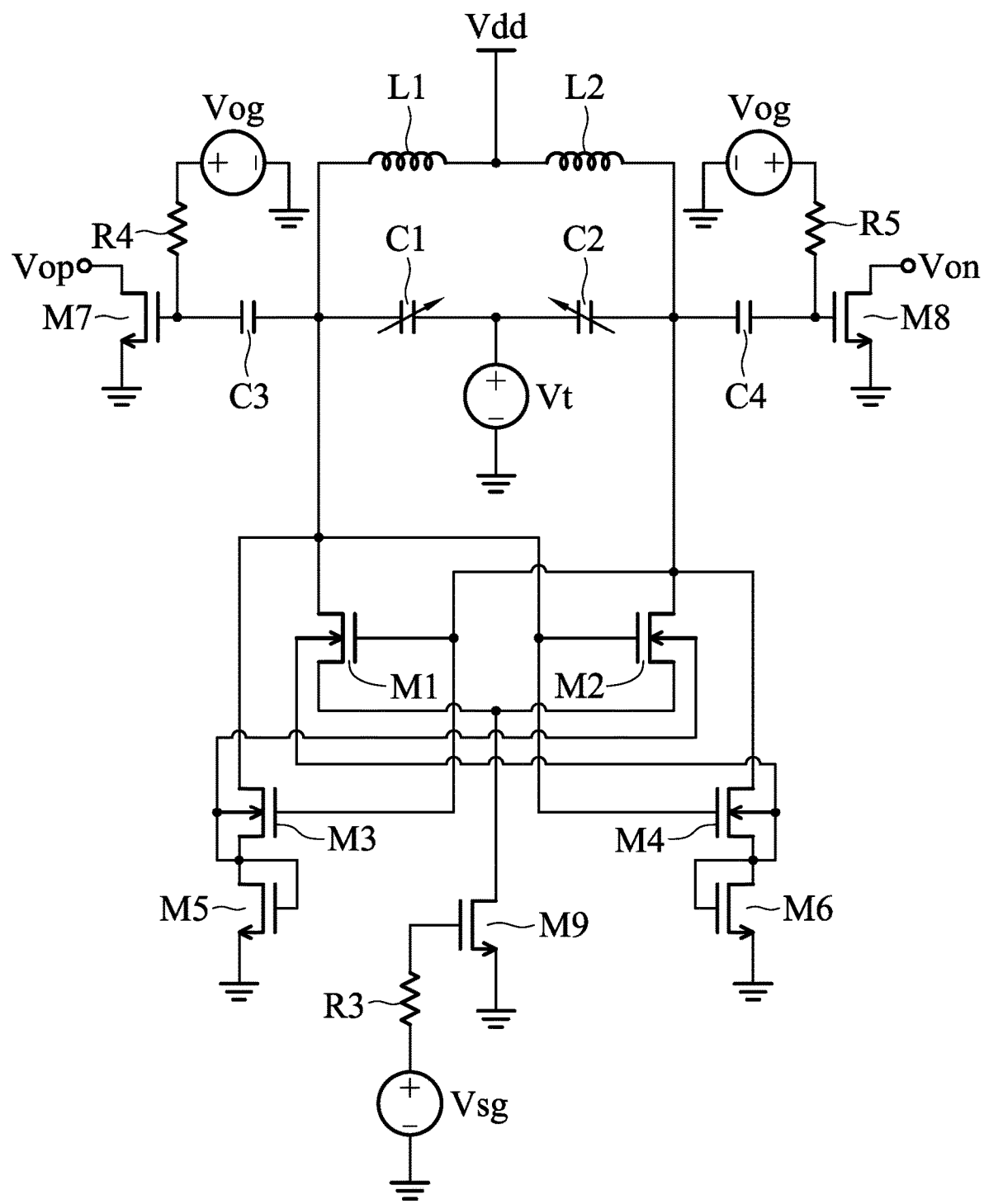
FIG. 3 is a circuit diagram of a transconductance ($g_m$) controlling circuit according to another embodiment of the disclosure.

FIG. 3 is a circuit diagram of a transconductance ($g_m$) controlling circuit according to another embodiment of the disclosure. The circuit diagram of FIG. 3 is for illustrating the embodiments of the disclosure, but the disclosure should not be limited to what is shown in FIG. 3.

As shown in FIG. 3, unlike FIG. 2, the transconductance boosting circuit 130 may comprise a third transistor M3, a fourth transistor M4, a fifth transistor M5, and a sixth transistor M6. The fifth drain and the fifth gate of the fifth transistor M5 may be coupled to the third source of the third transistor M3. The sixth drain and the sixth gate of the sixth transistor M6 may be coupled to the fourth source of the fourth transistor M4. In addition, the fifth source of the fifth transistor M5 and sixth source of the sixth transistor M6 may be coupled to ground. The operations of the other elements of FIG. 3 are the same as FIG. 2, therefore, further details are not illustrated herein.

According to the transconductance controlling circuit provided in the embodiments of the invention, a transconductance boosting circuit is provided to boost the transconductance $g_m$ of the resistors of the negative-resistance unit-circuit to ensure the Q value $Q_L$ of the inductor of the resonance circuit can be increased. Therefore, according the transconductance controlling circuit provided in the embodiments of the invention, the phase noise of the VCO (i.e. the resonance circuit and the negative-resistance unit-circuit) can be reduced.

The wideband transimpedance amplifier circuit of the disclosure has a common-gate transistor that is taken as an input impedance, and the input impedance is adjusted adaptively.

Use of ordinal terms such as "first", "second", "third", etc., in the disclosure and claims is for description. It does not by itself connote any order relationship. Reference throughout this specification to "one embodiment" or "an embodiment" means that a particular feature, structure, or characteristic described in connection with the embodiment is included in at least one embodiment of the disclosure, but does not denote that they are present in every embodiment. Thus, the appearance of the phrases "in one embodiment" or "in an embodiment" in various places throughout this specification are not necessarily referring to the same embodiment of the disclosure.

The above paragraphs describe many aspects of the disclosure. Obviously, the teaching of the disclosure can be accomplished by many methods, and any specific configurations or functions in the disclosed embodiments present a representative condition. Those who are skilled in this technology will understand that all of the disclosed aspects in the disclosure can be applied independently or be incorporated.

While the disclosure has been described by way of example and in terms of preferred embodiment, it should be understood that the disclosure is not limited thereto. Those who are skilled in this technology can still make various alterations and modifications without departing from the scope and spirit of this disclosure. Therefore, the scope of the present disclosure shall be defined and protected by the following claims and their equivalents.

What is claimed is:

1. A transconductance controlling circuit, comprising:
   a resonance circuit, generating an oscillation signal according to an input voltage;
   a negative-resistance unit-circuit, coupled to a resonance circuit and comprising a first transistor and a second transistor; and
   a transconductance boosting circuit, coupled to the negative-resistance unit-circuit and comprising a third transistor and a fourth transistor,
   wherein a first drain of the first transistor is coupled to a third drain of the third transistor, a first gate of the first transistor is coupled to a third gate of the third transistor, the first gate of the first transistor is coupled to a second drain of the second transistor, and a first base of the first transistor is coupled to a fourth base of the fourth transistor and to a fourth source of the fourth transistor, and
   wherein the second drain of the second transistor is coupled to a fourth drain of the fourth transistor, a second gate of the second transistor is coupled to a fourth gate of the fourth transistor, the second gate of the second transistor is coupled to the first drain of the first transistor, and a second base of the second transistor is coupled to a third base of the third transistor and to a third source of the third transistor.

2. The transconductance controlling circuit of claim 1, wherein the resonance circuit is coupled to a drain power source, the first drain and the second drain.

3. The transconductance controlling circuit of claim 2, wherein the resonance circuit comprises a first inductor, a second inductor, a first capacitor, and a second capacitor, wherein the first inductor and the second inductor are coupled to the drain power source and the first capacitor and the second capacitor are coupled to the input voltage.

4. The transconductance controlling circuit of claim 1, wherein the transconductance boosting circuit further comprises a first resistor and a second resistor, wherein the third source of the third transistor is coupled to the first resistor, and the fourth source of the fourth transistor is coupled to the second resistor, and the first resistor and the second resistor are coupled to a ground.

5. The transconductance controlling circuit of claim 1, wherein the transconductance boosting circuit further comprises a fifth transistor and a sixth transistor, wherein the third source of the third transistor is coupled to a fifth drain and a fifth gate of the fifth transistor, and the fourth source of the fourth transistor is coupled to a sixth drain and a sixth gate of the sixth transistor, and a fifth source of the fifth transistor and a sixth source of the sixth transistor are coupled to a ground.

6. The transconductance controlling circuit of claim 1, further comprising:
a first amplifier circuit, coupled to the resonance circuit, and comprising a seventh transistor; and
a second amplifier circuit, coupled to the resonance circuit, and comprising an eighth transistor.

7. The wideband transimpedance amplifier circuit of claim 6, further comprising:
a bias current controlling circuit, coupled to the negative-resistance unit-circuit and comprising a ninth transistor and a third resistor.

8. A transconductance controlling circuit, comprising:
a voltage-controlled oscillator, generating an oscillation signal according to an input voltage and comprising a negative-resistance unit-circuit, wherein the negative-resistance unit-circuit comprises a first transistor and a second transistor; and
a transconductance boosting circuit, coupled to the negative-resistance unit-circuit and comprising a third transistor and a fourth transistor,
wherein a first drain of the first transistor is coupled to a third drain of the third transistor, a first gate of the first transistor is coupled to a third gate of the third transistor, the first gate of the first transistor is coupled to a second drain of the second transistor, and a first base of the first transistor is coupled to a fourth base of the fourth transistor and to a fourth source of the fourth transistor, and
wherein the second drain of the second transistor is coupled to a fourth drain of the fourth transistor, a second gate of the second transistor is coupled to a fourth gate of the fourth transistor, the second gate of the second transistor is coupled to the first drain of the first transistor, and a second base of the second transistor is coupled to a third base of the third transistor and to a third source of the third transistor.

9. The transconductance controlling circuit of claim 8, wherein the voltage-controlled oscillator further comprises a resonance circuit, and the resonance circuit generates an oscillation signal according to an input voltage.

10. The transconductance controlling circuit of claim 9, wherein the resonance circuit is coupled to a drain power source, the first drain and the second drain.

11. The transconductance controlling circuit of claim 10, wherein the resonance circuit comprises a first inductor, a second inductor, a first capacitor, and a second capacitor, wherein the first inductor and the second inductor are coupled to the drain power source and the first capacitor and the second capacitor are coupled to the input voltage.

12. The transconductance controlling circuit of claim 8, wherein the transconductance boosting circuit further comprises a first resistor and a second resistor, wherein the third source of the third transistor is coupled to the first resistor, and the fourth source of the fourth transistor is coupled to the second resistor, and the first resistor and the second resistor are coupled to a ground.

13. The transconductance controlling circuit of claim 8, wherein the transconductance boosting circuit further comprises a fifth transistor and a sixth transistor, wherein the third source of the third transistor is coupled to a fifth drain and a fifth gate of the fifth transistor, and the fourth source of the fourth transistor is coupled to a sixth drain and a sixth gate of the sixth transistor, and a fifth source of the fifth transistor and a sixth source of the sixth transistor are coupled to a ground.

14. The transconductance controlling circuit of claim 8, further comprising:
a first amplifier circuit, coupled to the resonance circuit, and comprising a seventh transistor; and
a second amplifier circuit, coupled to the resonance circuit, and comprising an eighth transistor.

15. The wideband transimpedance amplifier circuit of claim 8, further comprising:
a bias current controlling circuit, coupled to the negative-resistance unit-circuit and comprising a ninth transistor and a third resistor.

* * * * *